United States Patent
Tseng et al.

(10) Patent No.: US 12,190,941 B2
(45) Date of Patent: Jan. 7, 2025

(54) MEMORY CELL AND MEMORY DEVICE THEREOF

(71) Applicant: MACRONIX INTERNATIONAL CO., LTD., Hsinchu (TW)

(72) Inventors: Po-Hao Tseng, Taichung (TW); Feng-Min Lee, Hsinchu (TW)

(73) Assignee: MACRONIX INTERNATIONAL CO., LTD., Hsinchu (TW)

(*) Notice: Subject to any disclaimer, the term of this patent is extended or adjusted under 35 U.S.C. 154(b) by 167 days.

(21) Appl. No.: 18/147,015

(22) Filed: Dec. 28, 2022

(65) Prior Publication Data
US 2024/0221822 A1 Jul. 4, 2024

(51) Int. Cl.
*G11C 11/4091* (2006.01)

(52) U.S. Cl.
CPC ................. *G11C 11/4091* (2013.01)

(58) Field of Classification Search
CPC .................................................. G11C 11/4091
USPC .................................................. 365/189.011
See application file for complete search history.

(56) References Cited

U.S. PATENT DOCUMENTS

| | | | | |
|---|---|---|---|---|
| 5,889,303 A * | 3/1999 | Eckert | ...... | H10B 69/00 257/299 |
| 7,915,666 B2 * | 3/2011 | Yasui | ...... | G11C 16/10 257/317 |
| 8,331,150 B2 * | 12/2012 | Hsu | ...... | G11C 14/0063 365/185.08 |
| 11,664,070 B2 | 5/2023 | Lin et al. | | |
| 11,748,062 B2 | 9/2023 | Tseng et al. | | |
| 2002/0012272 A1 * | 1/2002 | Shukuri | ...... | G11C 16/26 365/185.24 |
| 2004/0109344 A1 * | 6/2004 | Yamauchi | ...... | G11C 7/12 365/154 |
| 2007/0164347 A1 * | 7/2007 | Kim | ...... | H10B 69/00 257/315 |
| 2008/0258205 A1 * | 10/2008 | Ishimaru | ...... | G11C 16/14 257/E21.21 |
| 2009/0237997 A1 * | 9/2009 | Rao | ...... | G11C 11/56 365/185.08 |
| 2012/0182064 A1 * | 7/2012 | Hiramoto | ...... | G11C 11/413 327/540 |
| 2013/0064015 A1 * | 3/2013 | Tailliet | ...... | G11C 29/06 365/185.18 |
| 2016/0104713 A1 * | 4/2016 | Hsieh | ...... | H10B 41/10 257/315 |

(Continued)

FOREIGN PATENT DOCUMENTS

| | | |
|---|---|---|
| TW | 462127 B | 11/2001 |
| TW | 202040756 A | 11/2020 |
| TW | 202230164 A | 8/2022 |

(Continued)

*Primary Examiner* — Ly D Pham
(74) *Attorney, Agent, or Firm* — McClure, Qualey & Rodack, LLP

(57) ABSTRACT

A memory cell and a memory device are provided. The memory cell comprises: a write transistor; and a read transistor coupled to the write transistor, the write transistor and the read transistor coupled at a storage node, the storage node being for storing data; wherein, at least one among the write transistor and the read transistor includes a threshold voltage adjusting layer, and a threshold voltage of the write transistor and/or the read transistor is adjustable.

16 Claims, 10 Drawing Sheets

(56) References Cited

U.S. PATENT DOCUMENTS

2022/0108742 A1   4/2022  Li
2024/0062817 A1*  2/2024  Kao .................... G11C 11/2273

FOREIGN PATENT DOCUMENTS

TW        202230367 A    8/2022
TW        202245070 A   11/2022

* cited by examiner

MEMORY CELL AND MEMORY DEVICE THEREOF

TECHNICAL FIELD

The disclosure relates in general to a memory cell and a memory device thereof and particularly relates to a dual-transistor memory cell and a memory device thereof.

BACKGROUND

Memory cells of dynamic random-access memory (DRAM) are for example one transistor-one capacitor (1T1C) memory cells.

1T1C memory cells have good reliability and high integration density. However, the single capacitor of the 1T1C memory cell is not scalable because the single capacitor needs to store enough charge and maintain a long retention time. Thus, the single capacitor requires high aspect ratio, which is challenging to fabricate.

When the cell size is reduced, the off-current of the transistor is increased, which limits DRAM scaling. Also, it becomes difficult to main the current refresh time.

Thus, there is a need to maintain the low off-current while reducing the memory cell size.

SUMMARY

According to one embodiment, a memory cell is provided. The memory cell comprises: a write transistor; and a read transistor coupled to the write transistor, the write transistor and the read transistor coupled at a storage node, the storage node being for storing data; wherein, at least one among the write transistor and the read transistor includes a threshold voltage adjusting layer, and a threshold voltage of the write transistor and/or the read transistor is adjustable.

According to another embodiment, a memory device is provided. The memory device includes: a memory array including a plurality of memory cells, a plurality of first signal lines, a plurality of second signal lines, a plurality of third signal lines and a plurality of fourth signal lines, the memory cells coupled to the first, the second, the third and the fourth signal lines; a plurality of driving circuits coupled to the memory array, for applying a plurality of driving voltages to the memory cells via the first, the second, the third and the fourth signal lines to write or read the memory cells; and a plurality of sensing amplifiers coupled to the memory array, for sensing a plurality of read currents from the memory cells. Each of the memory cells comprises: a write transistor; and a read transistor coupled to the write transistor, the write transistor and the read transistor coupled at a storage node, the storage node being for storing data; wherein, at least one among the write transistor and the read transistor includes a threshold voltage adjusting layer, and a threshold voltage of the write transistor and/or the read transistor is adjustable.

Figure 1A:
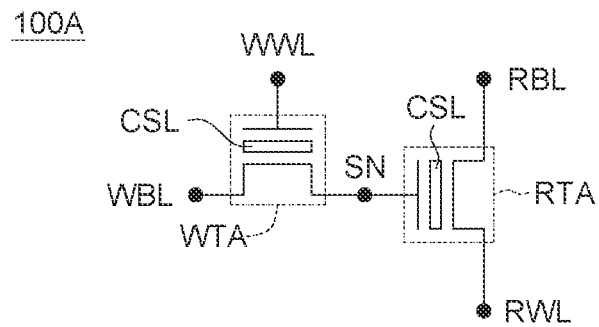
FIG. 1A to FIG. 1C show the memory cells according to several embodiments of the application.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

DESCRIPTION OF THE EMBODIMENTS

Technical terms of the disclosure are based on general definition in the technical field of the disclosure. If the disclosure describes or explains one or some terms, definition of the terms is based on the description or explanation of the disclosure. Each of the disclosed embodiments has one or more technical features. In possible implementation, one skilled person in the art would selectively implement part or all technical features of any embodiment of the disclosure or selectively combine part or all technical features of the embodiments of the disclosure.

Figure 1B:
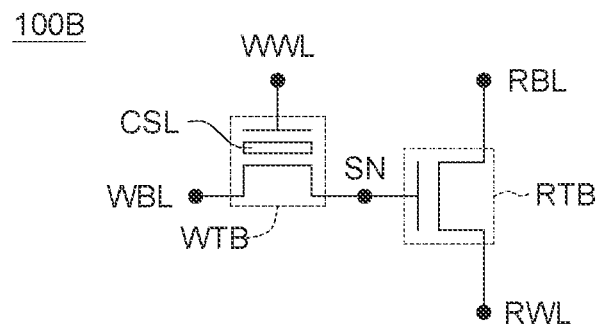
Figure 1C:
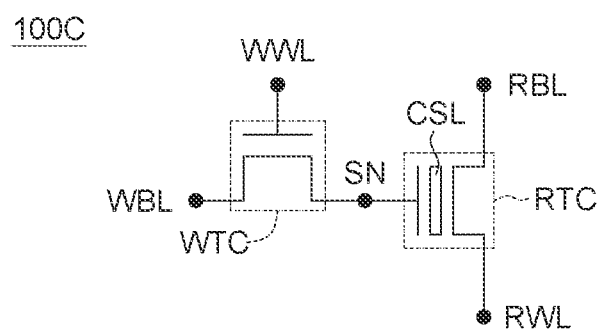

FIG. 1A to FIG. 1C show the memory cells according to several embodiments of the application. As shown in FIG. 1A, the memory cell 100A according to one embodiment of the application includes a first transistor WTA and a second transistor RTA coupled to the first transistor WTA. The first transistor WTA is also referred as a write transistor and the second transistor RTA is also referred as a read transistor. The write transistor WTA and the read transistor RTA is coupled at a storage node SN and the storage node SN is for storing data (logic 1 or logic 0).

The write transistor WTA is for example but not limited by indium gallium zinc oxide (IGZO) thin-film transistor (TFT). In read operations, even if the gate is applied by 0V voltage, IGZO-TFT still has low off-current, and thus the leakage current of the memory cell 100A is kept low to enhance data retention of the memory cell 100A. Also, IGZO-TFT is easily integrated to BEOL (Back End of Line) for reducing circuit area and improving storage density.

The read transistor RTA is for example but not limited by, Silicon nanowire field-effect transistor (Si-NW FET). Si-NW FET may provide high read current for fast read operations.

The write transistor WTA includes: a first terminal (for example but not limited by, a drain) coupled to a write bit line WBL; a second terminal (for example but not limited by, a source) coupled to the storage node SN; and a control terminal (for example but not limited by, a gate) coupled to a write word line WWL. The channel of the write transistor WTA includes a charge storage layer CSL. The charge storage layer CSL is for example but not limited by Silicon-Oxide-Nitride-Oxide-Silicon (SONOS).

The read transistor RTA includes: a first terminal (for example but not limited by, a drain) coupled to a read bit line RBL; a second terminal (for example but not limited by, a source) coupled to a read word line RWL; and a control terminal (for example but not limited by, a gate) coupled to the storage node SN. The channel of the read transistor RTA includes the charge storage layer CSL.

The write bit line WBL, the write word line WWL, the read bit line RBL and the read word line RWL are also referred as the signal lines.

As shown in FIG. 1B, the memory cell 100B according to one embodiment of the application includes a first transistor (the write transistor) WTB and a second transistor (the read transistor) RTB. The first transistor WTB is substantially the same or similar to the first transistor WTA in FIG. 1A and the details are omitted.

The main difference between the second RTB and the second transistor RTA in FIG. 1A is that, the second transistor RTB does not include the charge storage layer.

As shown in FIG. 1C, the memory cell 100C according to one embodiment of the application includes a first transistor (the write transistor) WTC and a second transistor (the read transistor) RTC. The main difference between the first transistor WTC and the first transistor WTA in FIG. 1A is that, the first transistor WTC does not include the charge storage layer.

The second transistor RTC is substantially the same or similar to the second transistor RTA in FIG. 1A and the details are omitted.

From FIG. 1A to FIG. 1C, the memory cells 100A-100C of the embodiments of the application are four-terminal elements. Further, from FIG. 1A to FIG. 1C, the memory cell of the embodiment of the application includes: a write transistor with or without the charge storage layer (the write transistor having very low off-current); and a read transistor with or without the charge storage layer (the read transistor having very high read current), wherein at least one among the write transistor and the read transistor has the charge storage layer.

In one embodiment of the application, channel material of the write transistor WTA~WTC includes, for example but not limited by, any one of the following: IGZO, Poly-Si, Amorphous silicon (a-Si), Poly-Ge, a-Ge and so on. In one embodiment of the application, channel material of the read transistor RTA~RTC includes, for example but not limited by, any one of the following: Single crystal Si, Single crystal Ge, III-V Materials, IGZO and so on.

Figure 2:
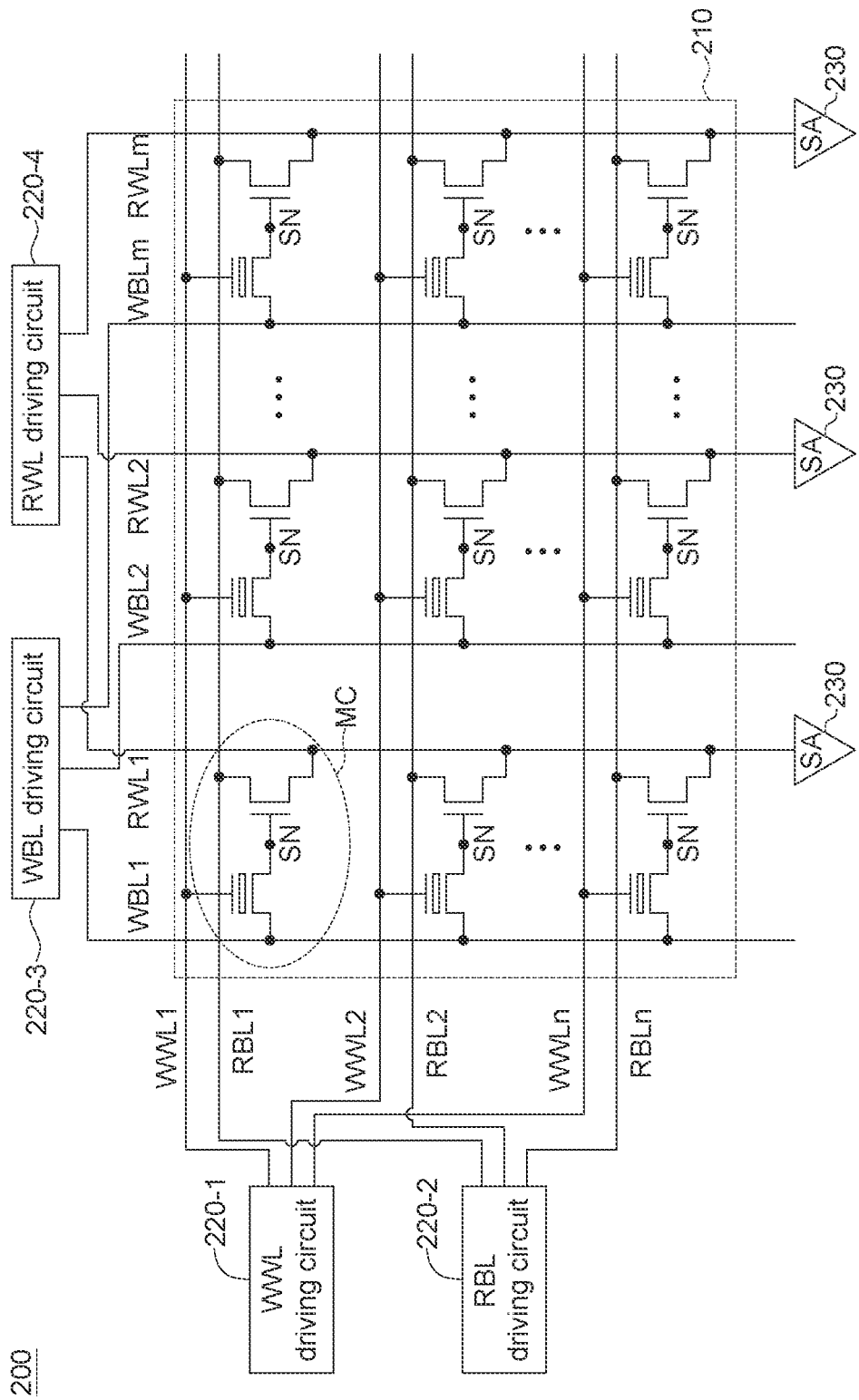
FIG. 2 shows a memory device according to one embodiment of the application.

FIG. 2 shows a memory device according to one embodiment of the application. As shown in FIG. 2, the memory device 200 according to one embodiment of the application includes a memory array 210, a plurality of driving circuits 220-1~220-4 and a plurality of sensing amplifiers (SA) 230.

The memory array 210 includes a plurality of memory cells MC arranged in an array, a plurality of write word lines WWL1~WWLn, a plurality of read bit lines RBL1~RBLn, a plurality of write bit lines WBL1~WBLm and a plurality of read word lines RWL1~RWLm. Although in FIG. 2, the memory cells MC are implemented by the memory cell 100B, in other possible embodiments of the application, the memory cells MC may be implemented by the memory cells 100A or 100C.

The memory cells MC are coupled to the write word lines WWL1~WWLn, the read bit lines RBL1~RBLn, the write bit lines WBL1~WBLm and the read word lines RWL1~RWLm. Further, the memory cells MC are at intersections of the write word lines WWL1~WWLn, the read bit lines RBL1~RBLn, the write bit lines WBL1~WBLm and the read word lines RWL1~RWLm.

The plurality of driving circuits 220-1~220-4 are coupled to the memory array 210. The driving circuits 220-1~220-4 include: a write word line driving circuit 220-1, a read bit line driving circuit 220-2, a write bit line driving circuit 220-3 and a read word line driving circuit 220-4. The driving circuits 220-1~220-4 applying driving voltages via the write word lines WWL1~WWLn, the read bit lines RBL1~RBLn, the write bit lines WBL1~WBLm and the read word lines RWL1~RWLm to the memory cells MC for writing or reading the memory cells MC.

The sensing amplifiers 230 are coupled to the read word lines RWL1~RWLm for sensing a plurality of read currents from the memory cell MC. Based on sensing results of the SAs 230, storage data of the respective memory cells MC are determined to be logic 1 or logic 0.

Figure 3:
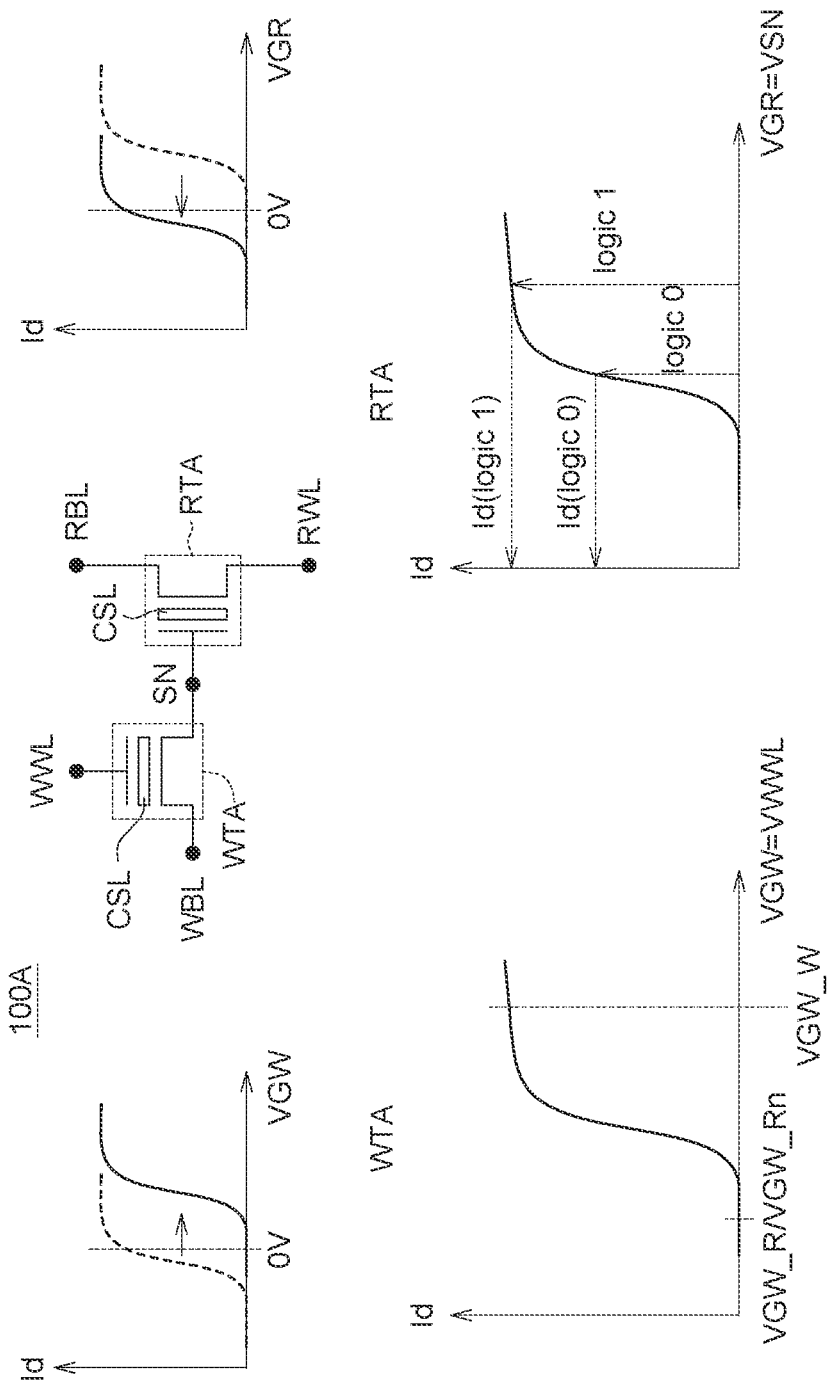
FIG. 3 shows a current-voltage characteristic curve of the write transistor and the read transistor according to one embodiment of the application.

FIG. 3 shows a current-voltage characteristic curve of the write transistor and the read transistor according to one embodiment of the application. The threshold voltage(s) of the write transistor and/or the read transistor according to one embodiment of the application is/are adjustable. For example but not limited by, the threshold voltage of the write transistor is adjusted to be higher than 0V and the threshold voltage of the read transistor is adjusted to be lower than 0V.

For example but not limited by, the threshold voltage VtW of the write transistor is: VGW_W>VtW>VGW_R (or VGW_Rn), wherein VGW_W refers to the voltage applied to the write word line WWL during write operations (i.e. the gate voltage of the write transistor during write operations), VGW_R refers to the voltage applied to the write word line WWL during read operations (i.e. the gate voltage of the write transistor during read operations), VGW_Rn refers to the voltage applied to the write word line WWL during retention operations (i.e. the gate voltage of the write transistor during retention operations). VGW refers to the gate voltage of the write transistor. VGW=VWWL, VWWL refers to the voltage of the write word line WWL.

For example but not limited by, the threshold voltage of the read transistor is adjusted to be that, in read operations, the read current Id in reading logic 1 (the storage node SN stores logic 1) is higher than a reference current Isense while the read current Id in reading logic 0 (the storage node SN stores logic 0) is lower than the reference current Isense. VGR refers to the gate voltage of the read transistor, VGR=VSN, wherein VSN refers to the voltage of the storage node SN.

Figure 4:
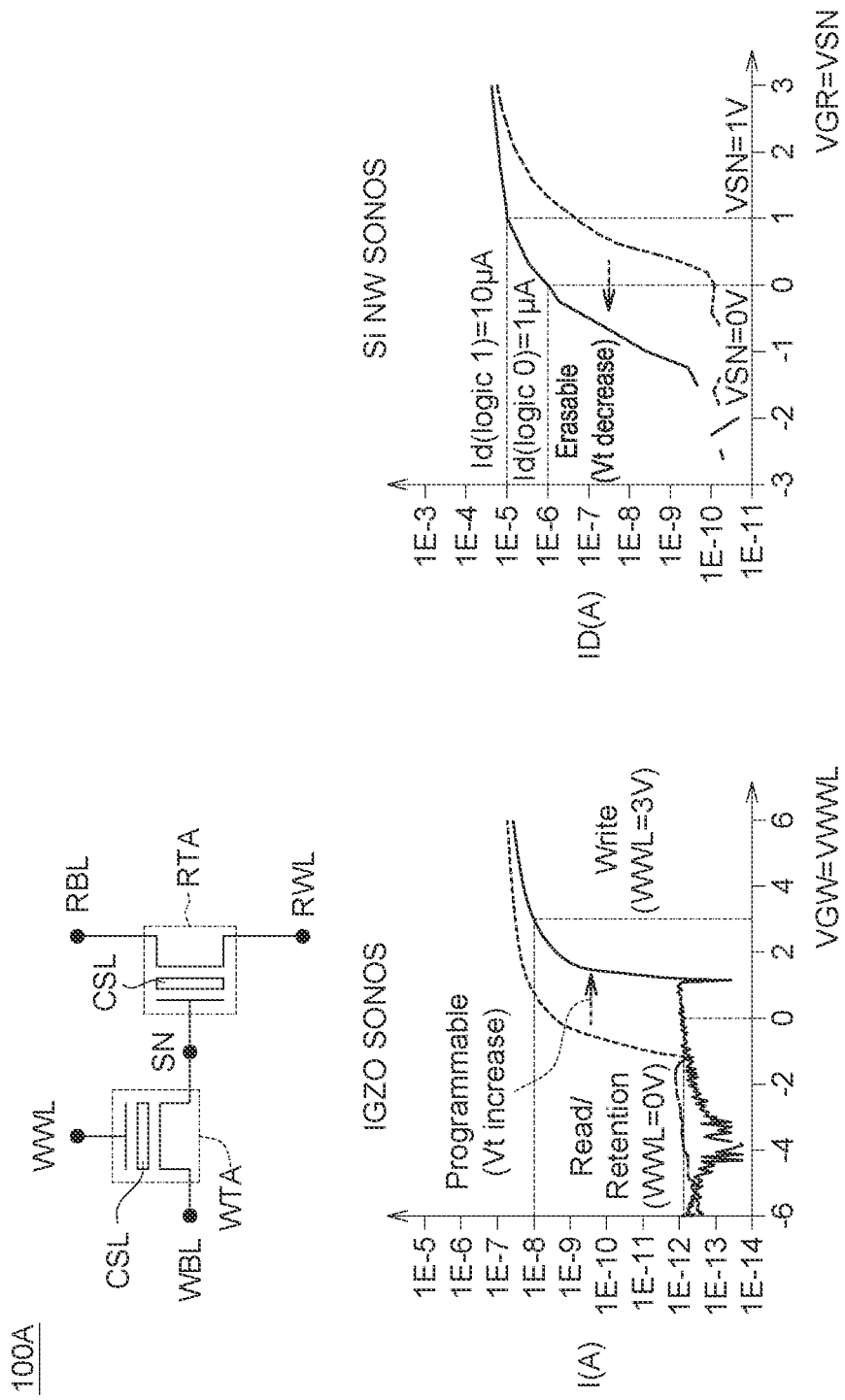
FIG. 4 shows a current-voltage characteristic curve of the write transistor and the read transistor of the memory cell according to one embodiment of the application.

Write operations and read operations of the memory cell in one embodiment of the application are described. FIG. 4 shows a current-voltage characteristic curve of the write transistor and the read transistor of the memory cell 100A according to one embodiment of the application.

Table 1 shows voltages applied to the write word line WWL, the write bit line WBL, the read word line RWL and the read bit line RBL during write operations, read operations and retention operations of one embodiment of the application, which is not to limit the application.

TABLE 1

|     | Writing logic 0 | Writing logic 1 | Retention          | Read |
| --- | --------------- | --------------- | ------------------ | ---- |
| WWL | 3 V             | 3 V             | 0 V                | 0 V  |
| WBL | 0 V             | 1 V             | 0 V/1 V (don't care) | 0 V  |

TABLE 1-continued

|  | Writing logic 0 | Writing logic 1 | Retention | Read |
|---|---|---|---|---|
| RWL | 0 V | 0 V | 0 V | 0 V |
| RBL | 0 V | 0 V | 0 V | 0.8 V |

In write operations, a 3V voltage is applied to the write word line WWL to conduct the write transistor; in writing logic 0, a 0V voltage is applied to the write bit line WBL to write the 0V voltage into the storage node SN via the write bit line WBL; and in writing logic 1, a 1V voltage is applied to the write bit line WBL to write the 1V voltage into the storage node SN via the write bit line WBL. Further, in write operations, a 0V voltage is applied to the read word line RWL and the read bit line RBL.

In retention operations, a 0V voltage is applied to the write word line WWL, the read word line RWL and the read bit line RBL; and a 0V or 1V voltage is applied to the write bit line WBL.

In read operations, the write transistor is turned off. Thus, in read operations, a 0V voltage is applied to the write word line WWL (i.e. a 0V voltage is applied to the gate of the write transistor) to turn off the write transistor; and a 0V voltage is applied to the write bit line WBL, a 0V voltage is applied to the read word line RWL; and a 0.8V voltage is applied to the read bit line RBL.

In one embodiment of the application, when the write transistor has a channel material made of IGZO-TFT SONOS, the write transistor provides low leakage current (low off-current) and the threshold voltage of the write transistor is adjustable. In one embodiment of the application, by adjusting the threshold voltage of the write transistor to be higher than 0V, in read operations, the gate transistor of the write transistor does not have to be a negative voltage, which prevents negative influence. The negative influence indicates, for example but not limited by, additional circuit area or additional chip power consumption. In prior art, there needs additional circuits for generating negative voltages, which increase additional circuit area. But in one embodiment of the application, ° in read operations, the gate transistor of the write transistor does not have to be a negative voltage, which prevents additional circuits for generating negative voltages. Further, because the 0V gate voltage is able to turn off the write transistor, in retention, no additional negative voltages are needed, which also prevents additional chip power consumption. This is because additional negative voltages also increase additional chip power consumption.

In one embodiment of the application, by adjusting the threshold voltage of the read transistor to be lower than 0V, in case that the read transistor is a Si-NW SONOS transistor, when the read transistor is at the erase state, the read transistor still provides high read current in the saturation region for fast read operations.

Figure 5:
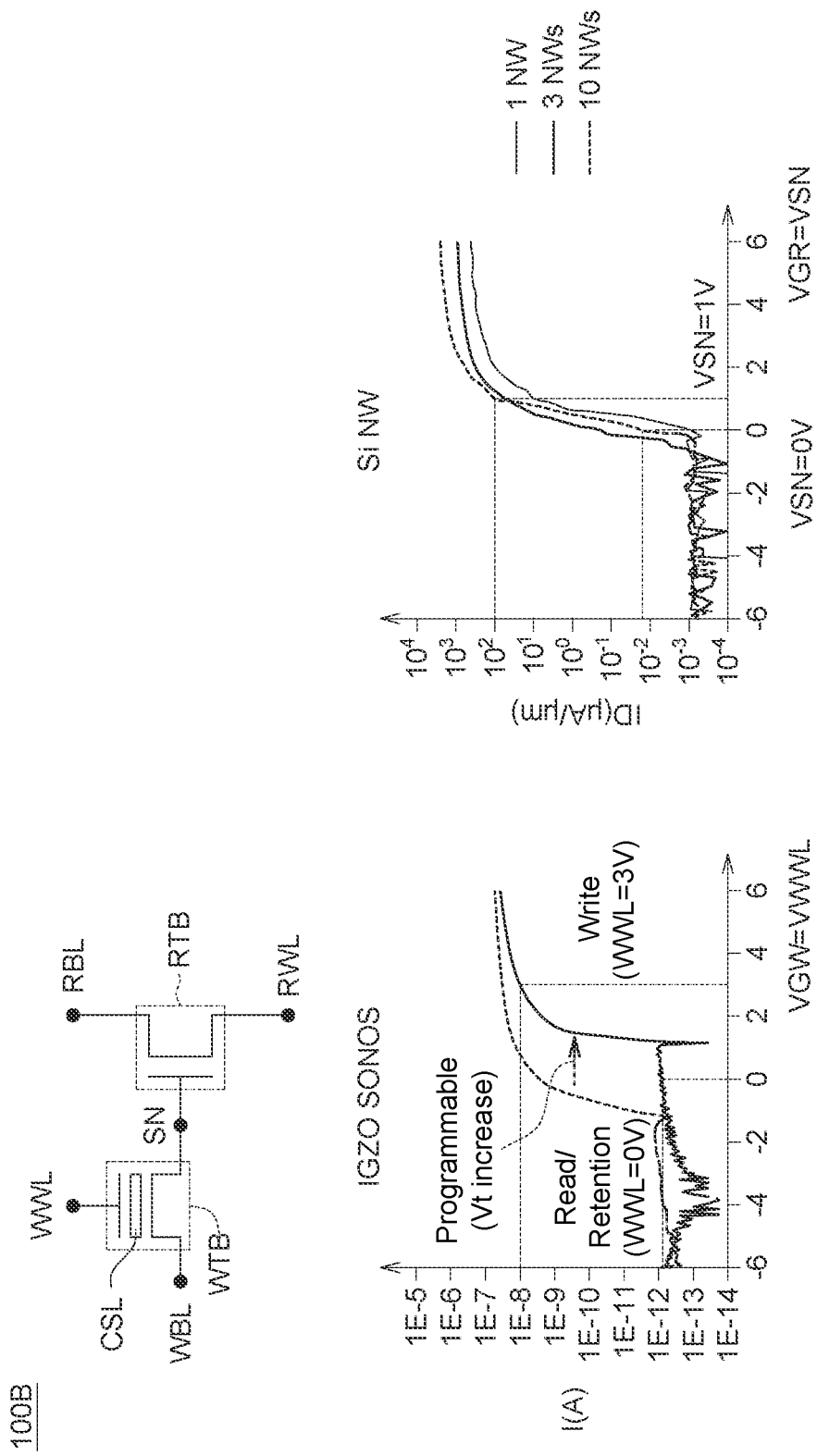
FIG. 5 shows a current-voltage characteristic curve of the write transistor and the read transistor of the memory cell according to another embodiment of the application.

FIG. 5 shows a current-voltage characteristic curve of the write transistor and the read transistor of the memory cell 100B according to one embodiment of the application.

Table 2 shows voltages applied to the write word line WWL, the write bit line WBL, the read word line RWL and the read bit line RBL during write operations, read operations and retention operations of one embodiment of the application, which is not to limit the application.

TABLE 2

|  | Writing logic 0 | Writing logic 1 | Retention | Read |
|---|---|---|---|---|
| WWL | 3 V | 3 V | 0 V | 0 V |
| WBL | 0 V | 1 V | 0 V/1 V (don't care) | 0 V |
| RWL | 0 V | 0 V | 0 V | 0 V |
| RBL | 0 V | 0 V | 0 V | 0.8 V |

Table 2 is substantially the same as table 1 and thus are omitted here.

In one embodiment of the application, when the write transistor has a channel material made of IGZO-TFT SONOS, the write transistor provides low leakage current (low off-current) and the threshold voltage of the write transistor is adjustable. In one embodiment of the application, by adjusting the threshold voltage of the write transistor to be higher than 0V, in read operations, the gate transistor of the write transistor does not have to be a negative voltage, which prevents negative influence.

In one embodiment of the application, in case that the read transistor is a Si-NW transistor, even if in the sub-threshold region, the read transistor provides high read current for fast read operations. The read current of the read transistor is adjustable based on the number of the nanowire.

Figure 6:
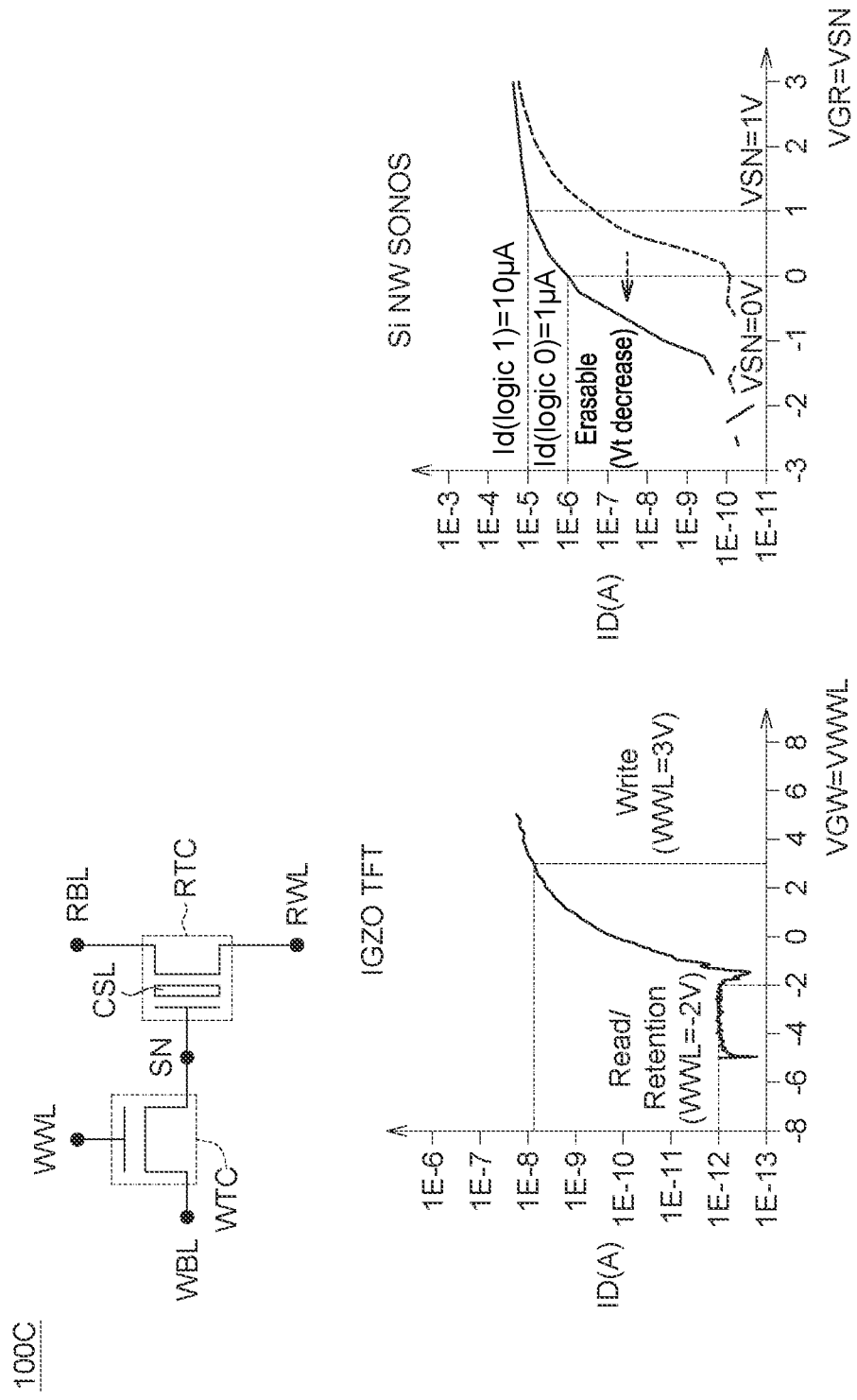
FIG. 6 shows a current-voltage characteristic curve of the write transistor and the read transistor of the memory cell according to yet another embodiment of the application.

FIG. 6 shows a current-voltage characteristic curve of the write transistor and the read transistor of the memory cell 100C according to one embodiment of the application.

Table 3 shows voltages applied to the write word line WWL, the write bit line WBL, the read word line RWL and the read bit line RBL during write operations, read operations and retention operations of one embodiment of the application, which is not to limit the application.

TABLE 3

|  | Writing logic 0 | Writing logic 1 | Retention | Read |
|---|---|---|---|---|
| WWL | 3 V | 3 V | −2 V | −2 V |
| WBL | 0 V | 1 V | 0 V/1 V (don't care) | 0 V |
| RWL | 0 V | 0 V | 0 V | 0 V |
| RBL | 0 V | 0 V | 0 V | 0.8 V |

In table 3, because the write transistor does not include the charge storage layer and thus in read operations, a negative voltage is applied to the gate of the write transistor for turning off the write transistor. Other parts of the table 3 are substantially the same or similar to the table 1 and thus are omitted here.

In one embodiment of the application, when the write transistor is an IGZO-TFT, a negative bias is applied to the gate of the write transistor and thus the write transistor provides low leakage current (low off-current).

In one embodiment of the application, in case that the read transistor is a Si-NW SONOS transistor, when the read transistor is at the erase state, in the saturation region, the read transistor provides high read current for fast read operations.

Figure 7A:
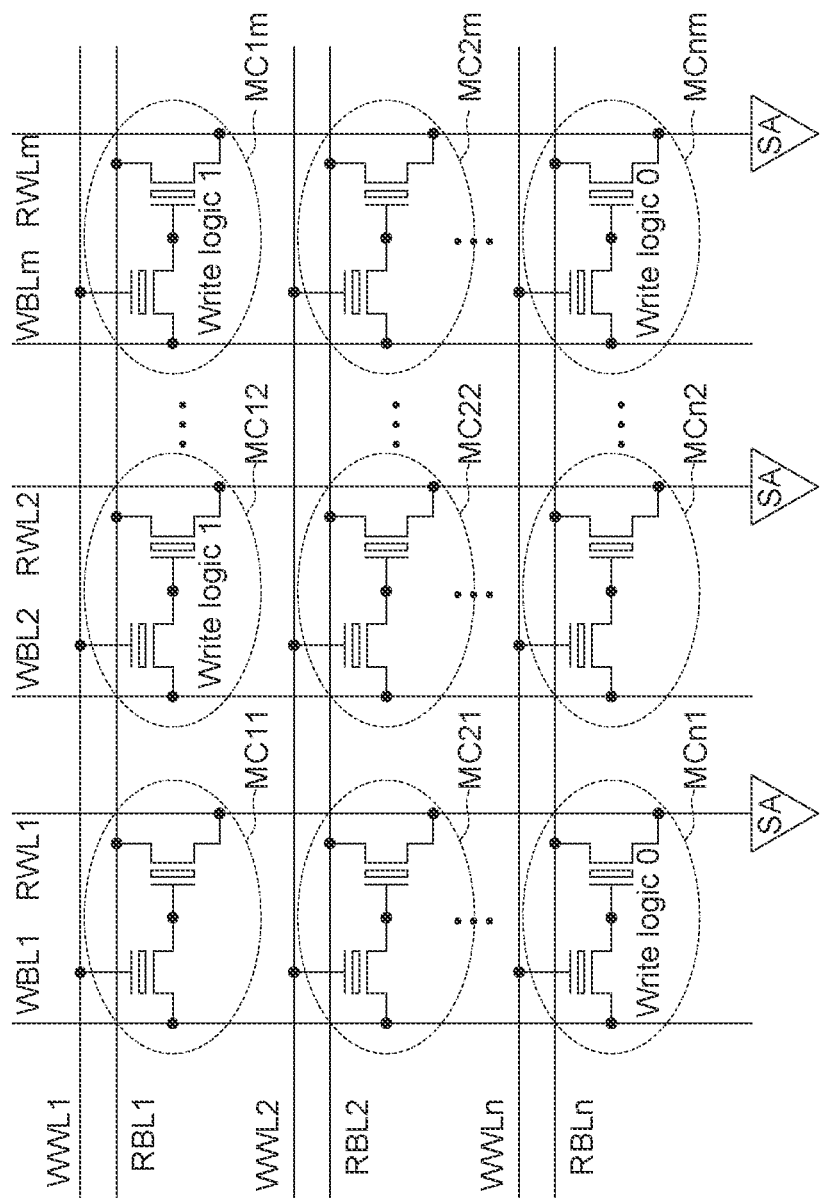
FIG. 7A shows write operations of the memory device in one embodiment of the application.
Figure 7B:
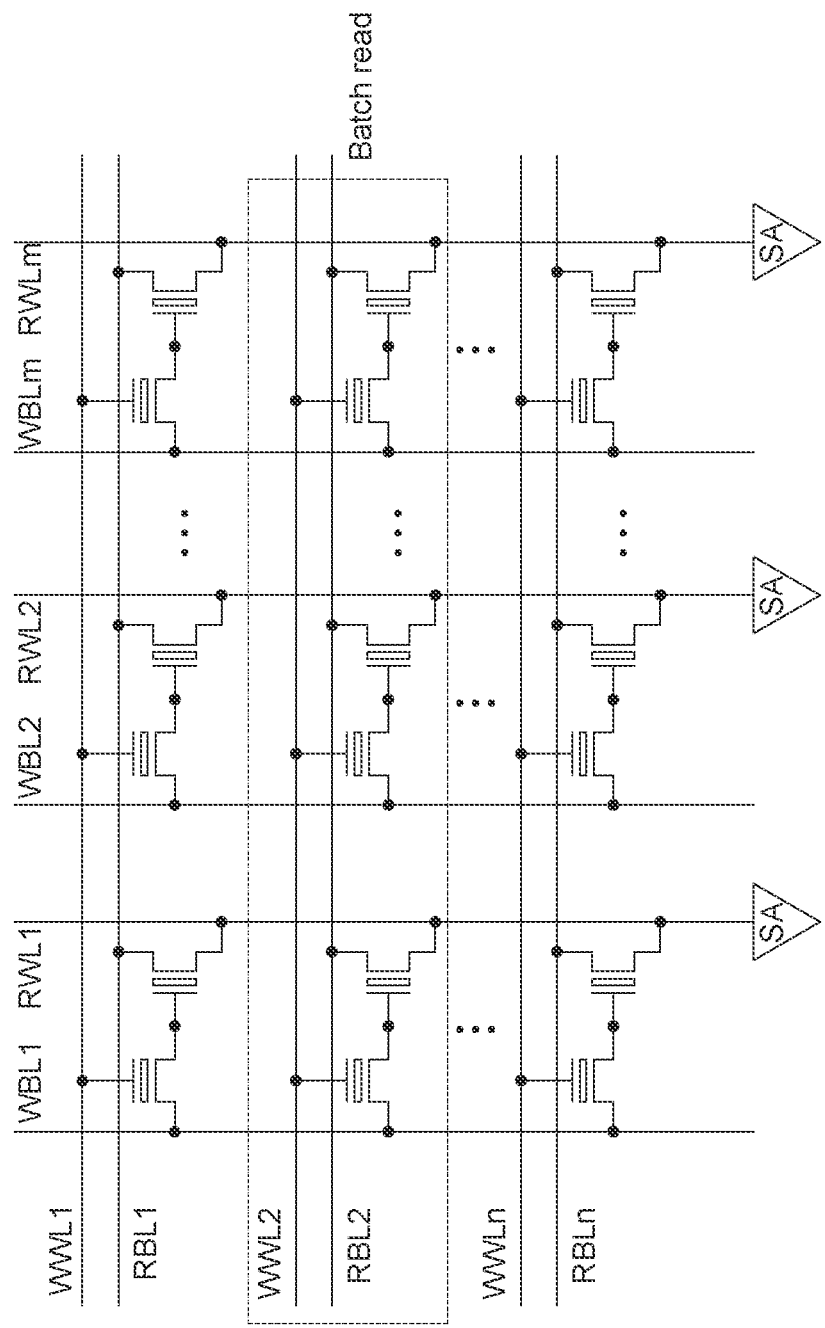
FIG. 7B shows read operations of the memory device in one embodiment of the application.

FIG. 7A shows write operations of the memory device in one embodiment of the application. FIG. 7B shows read operations of the memory device in one embodiment of the application. The memory array includes the memory cells MC11~MCnm.

In FIG. 7A, the memory cells MC12, MC1m, MCn1 and MCnm are selected while the other memory cells are unselected. In one embodiment of the application, the memory cells are randomly selected for data writing.

Table 4 shows voltages applied to the write word line WWL, the write bit line WBL, the read word line RWL and the read bit line RBL of the selected memory cells and the unselected memory cells during write operations, read operations and retention operations of one embodiment of the application, which is not to limit the application.

TABLE 4

|  | Writing logic 0 | Writing logic 1 | Retention | Read |
|---|---|---|---|---|
| Selected WWL | 3 V | 3 V | 0 V | 0 V |
| Selected WBL | 0 V | 1 V | 0 V | 0 V |
| Selected RWL | 0 V | 0 V | 0 V | 0 V |
| Selected RBL | 0 V | 0 V | 0 V | 0.8 V |
| Unselected WWL | 0 V | 0 V | 0 V | 0 V |
| Unselected WBL | 0 V | 0 V | 0 V | 0 V |
| Unselected RWL | 0 V | 0 V | 0 V | 0 V |
| Unselected RBL | 0 V | 0 V | 0 V | 0 V |

In the table 4, in write operations, voltages applied to the selected memory cells may be the same as the voltages in table 1, table 2 or table 3 while voltages applied to the unselected memory cells are substantially 0V.

In one embodiment of the application, the read operations are performed in a batch, and all the write transistors are turned off. FIG. 7B shows that the read bit line RBL2 is selected while the other read bit lines are unselected. The read bit line RBL2 is applied by 0.8V to read data stored in the memory cells MC21~MC2m of the selected read bit line RBL2 in batch (i.e. in the same time). The unselected read bit lines RBL1 and RBL3~ RBLn are applied by 0V to float all unselected memory cells for reducing leakage currents.

Figure 8A:
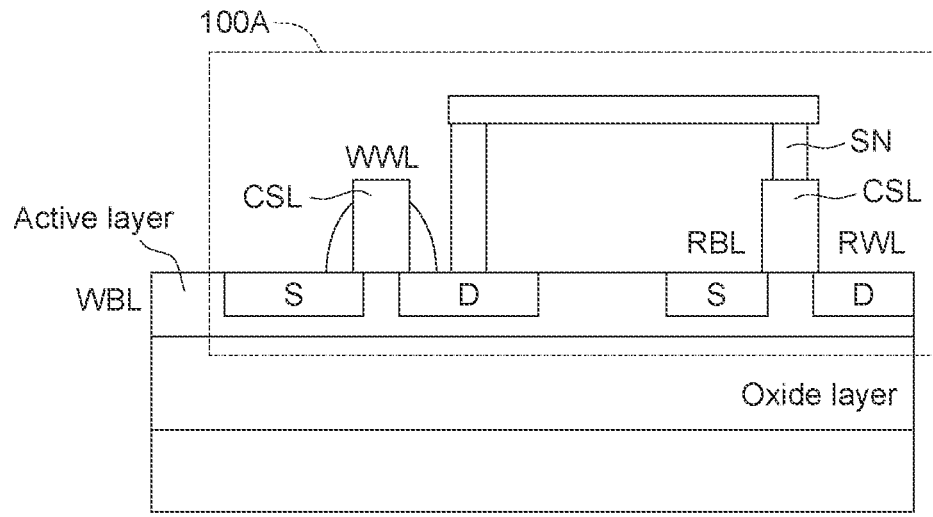
FIG. 8A shows 2D monolithic of the memory cell of one embodiment of the application.
Figure 8B:
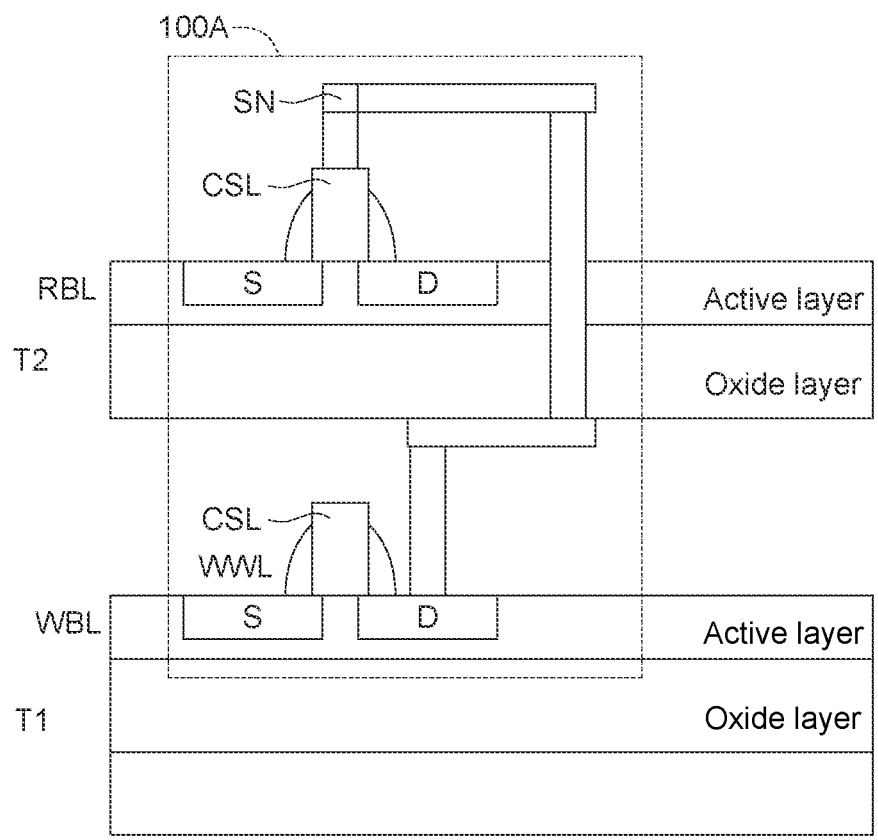
FIG. 8B and FIG. 8C show 3D monolithic stacking of the memory cell of one embodiment of the application.
Figure 8C:
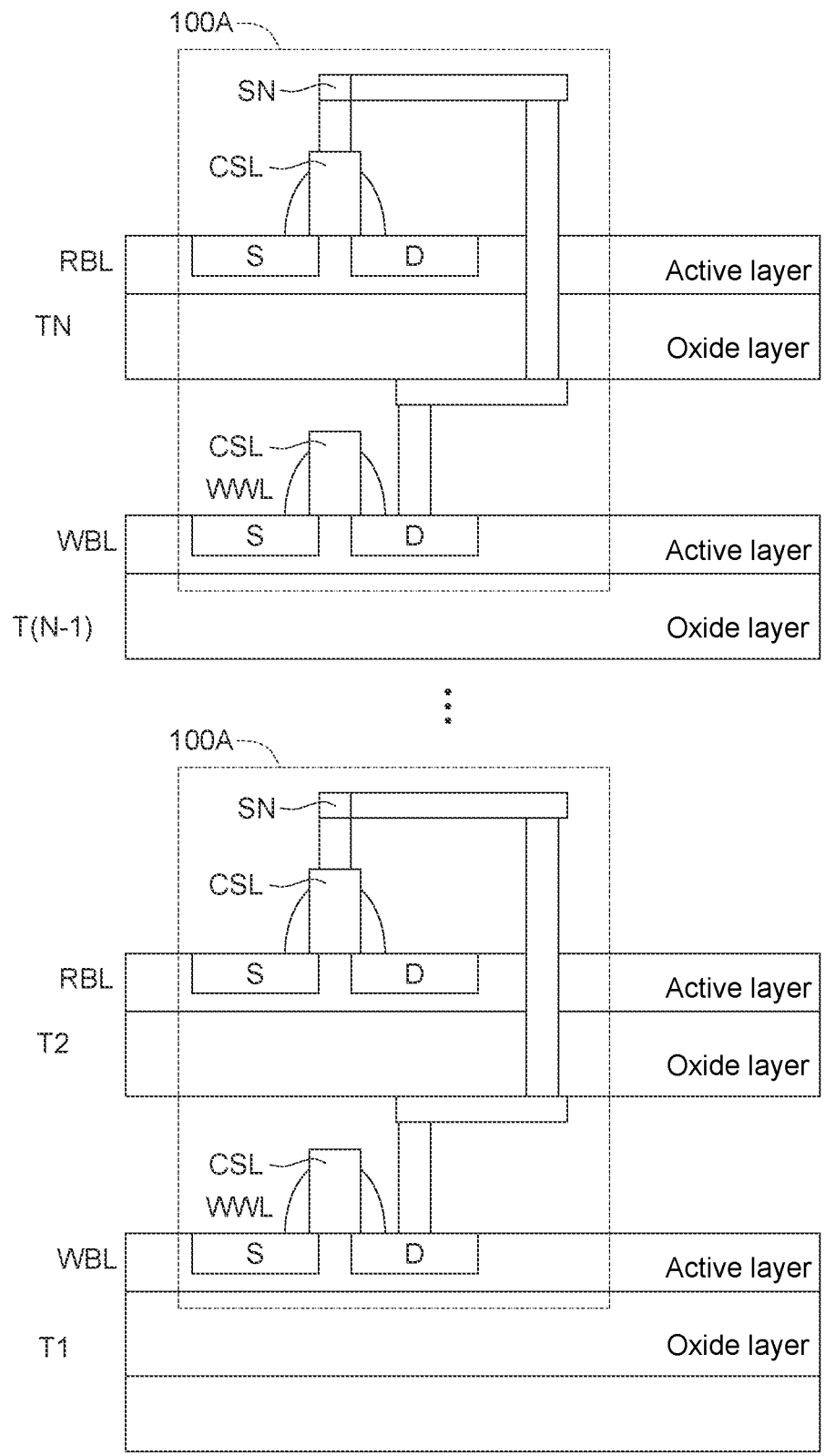

FIG. 8A shows 2D monolithic of the memory cell of one embodiment of the application. FIG. 8B and FIG. 8C show 3D monolithic stacking of the memory cell of one embodiment of the application. FIG. 8A to FIG. 8C show the memory cell 100A while the memory cell 100B or 100C are also applicable, which is still within the spirit and scope of the application.

As shown in FIG. 8A, the memory cell has a 2D monolithic structure, wherein the write transistor and the read transistor has the sources and the drains formed on the same active layer; and the drain of the write transistor and the storage node SN are connected by conductive lines.

As shown in FIG. 8B, the memory cell has a 3D monolithic structure, the write transistor is formed on the first tier T1 and the read transistor is formed on the second tier T2. Conductive lines connect different tiers. FIG. 8C shows the first tier T1 to the N-th tier TN (N being a positive integer).

By 3D monolithic stacking, the memory cell footprint is further reduced.

In one embodiment of the application, two-transistor-zero-capacitor (2T0C) memory cell is disclosed, which improves prior issues (the single capacitor has a large capacitor aspect ratio which is challenging).

As described above, in one embodiment of the application, the threshold voltage of the write transistor of the memory cell is adjustable to be higher than 0V; and in read operations, the gate voltage of the write transistor does not have to be lower than 0V, which prevents negative influence.

As described above, in one embodiment of the application, the threshold voltage of the read transistor of the memory cell is adjustable to be lower than 0V for providing high read current to achieve fast read operations.

In one embodiment of the application, the gate structure of the write transistor and/or the read transistor includes a charge storage layer, for example but not limited by, implemented by SONOS, a floating gate, a floating dot and so on. Via the charge storage layer, the threshold voltage(s) of the write transistor and/or the read transistor are/is adjustable.

Further, in one embodiment of the application, the gate structure of the write transistor and/or the read transistor includes a ferroelectric layer, that is, the write transistor and/or the read transistor is/are FeFET. Via the ferroelectric layer, the threshold voltage(s) of the write transistor and/or the read transistor are/is adjustable.

In one embodiment of the application, the charge storage layer and the ferroelectric layer are referred as a threshold voltage adjusting layer. That is, in the memory cell of one embodiment of the application, at least one among the write transistor and the read transistor includes the threshold voltage adjusting layer.

It will be apparent to those skilled in the art that various modifications and variations can be made to the disclosed embodiments. It is intended that the specification and examples be considered as exemplary only, with a true scope of the disclosure being indicated by the following claims and their equivalents.

What is claimed is:

1. A memory cell comprising:
    a write transistor; and
    a read transistor coupled to the write transistor, the write transistor and the read transistor coupled at a storage node, the storage node being for storing data;
    wherein, at least one among the write transistor and the read transistor includes a threshold voltage adjusting layer, and a threshold voltage of the write transistor and/or the read transistor is adjustable, and the storage node is connected to a control terminal of the read transistor.

2. The memory cell according to claim 1, wherein
    the threshold voltage adjusting layer includes a charge storage layer or a ferroelectric layer; and
    the charge storage layer is a Silicon-Oxide-Nitride-Oxide-Silicon (SONOS) or a floating gate or a floating dot.

3. The memory cell according to claim 1, wherein
    in a read operation, a 0V voltage is applied to a control terminal of the write transistor to turn off the write transistor.

4. The memory cell according to claim 1, wherein
    a channel material of the write transistor includes any one of the following: IGZO, poly-Si, amorphous silicon (a-Si), poly-Ge, a-Ge; and
    a channel material of the read transistor includes any one of the following: single crystal Si, single crystal Ge, III-V materials and IGZO.

5. The memory cell according to claim 1, wherein
    the memory cell is a two-dimension monolithic structure,
    the write transistor and the read transistor are formed on the same active layer, and
    a first terminal of the write transistor is connected to the storage node via a conductive line.

6. The memory cell according to claim 1, wherein
    the memory cell is a three-dimension monolithic stacking structure,
    the write transistor is formed on a first tier,
    the read transistor is formed on a second tier, and
    a conductive line connects between the first tier and the second tier.

7. The memory cell according to claim 1, wherein
    a control terminal of the write transistor and/or the control terminal of the read transistor includes the threshold voltage adjusting layer; and the threshold voltage of the write transistor is lower than a gate voltage of the write transistor during a write operation; and the threshold voltage of the write transistor is higher than the gate voltage of the write transistor during a read operation or a retention operation.

8. The memory cell according to claim 7, wherein
the threshold voltage of the read transistor is set that, in the read operation, a first read current in reading logic 1 is higher than a reference current, and a second read current in reading logic 0 is higher than the reference current.

9. A memory device including:
a memory array including a plurality of memory cells, a plurality of first signal lines, a plurality of second signal lines, a plurality of third signal lines and a plurality of fourth signal lines, the memory cells coupled to the first, the second, the third and the fourth signal lines;
a plurality of driving circuits coupled to the memory array, for applying a plurality of driving voltages to the memory cells via the first, the second, the third and the fourth signal lines to write or read the memory cells; and
a plurality of sensing amplifiers coupled to the memory array, for sensing a plurality of read currents from the memory cells,
wherein each of the memory cells comprising:
a write transistor; and
a read transistor coupled to the write transistor, the write transistor and the read transistor coupled at a storage node, the storage node being for storing data;
wherein, at least one among the write transistor and the read transistor includes a threshold voltage adjusting layer, and a threshold voltage of the write transistor and/or the read transistor is adjustable, and the storage node is connected to a control terminal of the read transistor.

10. The memory device according to claim 9, wherein
the threshold voltage adjusting layer includes a charge storage layer or a ferroelectric layer; and
the charge storage layer is a Silicon-Oxide-Nitride-Oxide-Silicon (SONOS) or a floating gate or a floating dot.

11. The memory device according to claim 9, wherein
in a read operation, a 0V voltage is applied to a control terminal of the write transistor to turn off the write transistor.

12. The memory device according to claim 9, wherein
a channel material of the write transistor includes any one of the following: IGZO, poly-Si, amorphous silicon (a-Si), poly-Ge, a-Ge; and
a channel material of the read transistor includes any one of the following: single crystal Si, single crystal Ge, III-V materials and IGZO.

13. The memory device according to claim 9, wherein
the memory cell is a two-dimension monolithic structure,
the write transistor and the read transistor are formed on the same active layer, and
a first terminal of the write transistor is connected to the storage node via a conductive line.

14. The memory device according to claim 9, wherein
the memory cell is a three-dimension monolithic stacking structure,
the write transistor is formed on a first tier,
the read transistor is formed on a second tier, and
a conductive line connects between the first tier and the second tier.

15. The memory device according to claim 9, wherein
a control terminal of the write transistor and/or the control terminal of the read transistor includes the threshold voltage adjusting layer; and
the threshold voltage of the write transistor is lower than a gate voltage of the write transistor during a write operation; and the threshold voltage of the write transistor is higher than the gate voltage of the write transistor during a read operation or a retention operation.

16. The memory device according to claim 15, wherein
the threshold voltage of the read transistor is set that, in the read operation, a first read current in reading logic 1 is higher than a reference current, and a second read current in reading logic 0 is higher than the reference current.

* * * * *